(12) United States Patent
Zhang

(10) Patent No.: US 12,065,600 B2
(45) Date of Patent: Aug. 20, 2024

(54) QUANTUM DOT LIGHT EMITTING DEVICE, LIGHT EMITTING LAYER AND MANUFACTURING METHOD THEREOF, AND DISPLAY DEVICE

(71) Applicants: Beijing BOE Technology Development Co., Ltd., Beijing (CN); BOE Technology Group Co., Ltd., Beijing (CN)

(72) Inventor: Aidi Zhang, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 199 days.

(21) Appl. No.: 17/435,369

(22) PCT Filed: Feb. 26, 2021

(86) PCT No.: PCT/CN2021/078105
§ 371 (c)(1),
(2) Date: Aug. 31, 2021

(87) PCT Pub. No.: WO2021/170080
PCT Pub. Date: Sep. 2, 2021

(65) Prior Publication Data
US 2023/0174855 A1    Jun. 8, 2023

(30) Foreign Application Priority Data
Feb. 28, 2020 (CN) .......... 202010128003.9

(51) Int. Cl.
C09K 11/02    (2006.01)
C09K 11/66    (2006.01)

(52) U.S. Cl.
CPC .......... *C09K 11/665* (2013.01); *C09K 11/025* (2013.01)

(58) Field of Classification Search
CPC .......... C09K 11/665; C09K 11/025
USPC .......... 423/466
See application file for complete search history.

(56) References Cited

U.S. PATENT DOCUMENTS

2021/0098726 A1    4/2021    Zhang

FOREIGN PATENT DOCUMENTS

| CN | 106449909 A | 2/2017 |
|----|-------------|--------|
| CN | 107083240 A | 8/2017 |
| CN | 107195741 A | 9/2017 |
| CN | 108929671 A | 12/2018 |

(Continued)

OTHER PUBLICATIONS

CN2020101280039 first office action.
PCT/CN2021/078105 international search report and written opinion.

*Primary Examiner* — Christopher M Raabe
(74) *Attorney, Agent, or Firm* — IPro, PLLC

(57) ABSTRACT

The embodiments of the present disclosure provides a quantum dot light emitting device, a light emitting layer and a manufacturing method thereof, and a display device. The device includes a perovskite quantum dot layer containing a second halogen element; a siloxane polymer film layer which is provided on a side of the perovskite quantum dot layer containing the second halogen element. The perovskite quantum dot layer containing the second halogen element and the siloxane polymer film layer are connected by a chemical bond.

19 Claims, 4 Drawing Sheets

(56) References Cited

FOREIGN PATENT DOCUMENTS

| CN | 106634961 B | * | 2/2019 | | |
|---|---|---|---|---|---|
| CN | 110635057 A | | 12/2019 | | |
| CN | 111057536 A | * | 4/2020 | | |
| CN | 108531173 B | * | 6/2021 | ............. | B82Y 20/00 |

* cited by examiner

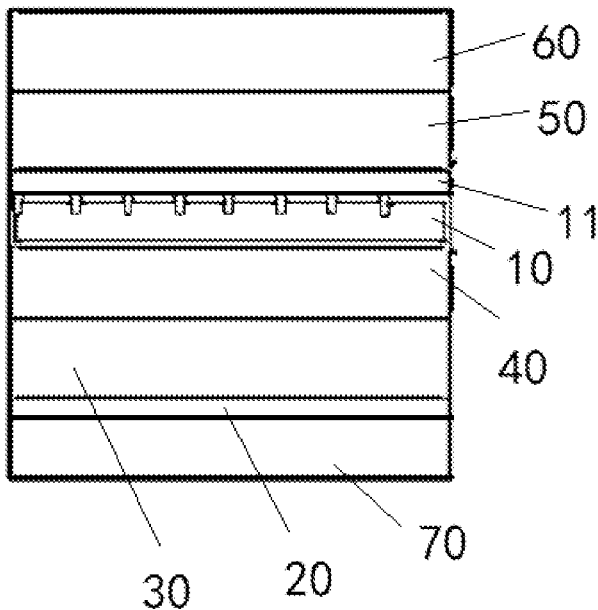

Fig. 3

| forming a perovskite quantum dot layer containing a first halogen element, the perovskite quantum dot layer containing the first halogen element having a carboxyl group | S11 |

| adding silane containing a second halogen element to the perovskite quantum dot layer containing the first halogen element to make them react with each other, so that at least part of the perovskite quantum dot layer containing the first halogen element is converted to a perovskite quantum dot layer containing the second halogen element, and a siloxane polymer film layer is formed on a side of the perovskite quantum dot layer containing the second halogen element close to the silane containing the second halogen element, and the perovskite quantum dot layer containing the second halogen element and the siloxane polymer film layer are connected by a chemical bond | S12 |

Fig. 4

QUANTUM DOT LIGHT EMITTING DEVICE, LIGHT EMITTING LAYER AND MANUFACTURING METHOD THEREOF, AND DISPLAY DEVICE

CROSS-REFERENCE TO RELATED APPLICATION

This application is the U.S. national phase of PCT Application No. PCT/CN2021/078105 filed on Feb. 26, 2021, which claims priority of Chinese Patent Application No. 202010128003.9 filed on Feb. 28, 2020, the disclosures of which are incorporated in its entirety by reference herein.

TECHNICAL FIELD

The present disclosure relates to the field of display technology, and in particular to a quantum dot light emitting device, a light emitting layer and a manufacturing method thereof, and a display device.

BACKGROUND

At present, perovskite quantum dot light-emitting diodes (PQLEDs) generally adopt a multilayer planar structure similar to QLEDs. There are two problems with such a structure. In the process of manufacturing the PQLED functional layer, non-polar solvents such as hexane, heptane, octane, toluene or chloroform are usually used for the film formation of the light emitting layer material. The electron transport layer usually uses zinc oxide nanoparticles, and zinc oxide is dispersed in a polar solvent such as ethanol. Ethanol has a very destructive effect on the ionic perovskite quantum dots, degrading or quenching the fluorescence performance of the perovskite, and thus resulting in a decreased device performance. In addition, in the PQLED device, the electron injection is excessive, and the relatively large energy level difference between the quantum dot light emitting layer and the hole transport layer will block the injection of holes, resulting in an imbalance in the injection rates of electrons and holes; excessive charge carriers accumulate at the interface barrier, which not only serves as a non-radiative recombination center, but also increases the turn-on voltage of the device and shortens the working stability of the device.

SUMMARY

The present disclosure adopts the following solutions:

In a first aspect, a quantum dot light emitting device according to an embodiment of the present disclosure includes:

a perovskite quantum dot layer containing a second halogen element;

a siloxane polymer film layer which is provided on a side of the perovskite quantum dot layer containing the second halogen element, the perovskite quantum dot layer containing the second halogen element and the siloxane polymer film layer being connected by a chemical bond.

Wherein, O atom in a carboxyl group in a ligand, which forms a coordinate bond with a quantum dot, in the perovskite quantum dot layer containing the second halogen element is connected to Si atom in the siloxane polymer film layer by a chemical bond.

Wherein, the siloxane polymer film layer has a —(Si—O—R)$_m$ structure, R is an alkyl group, and m is an integer greater than 1.

Wherein, the second halogen element includes Cl and/or Br.

Wherein, the quantum dot light emitting device further includes:

an anode;

a hole injection layer provided on the anode;

a hole transport layer provided on the hole injection layer, the perovskite quantum dot layer containing the second halogen element being provided on the hole transport layer;

an electron transport layer provided on the siloxane polymer film layer;

a cathode, the electron transport layer being provided between the siloxane polymer film layer and the cathode.

In a second aspect, a manufacturing method of a quantum dot light emitting layer according to an embodiment of the present disclosure includes:

forming a perovskite quantum dot layer containing a first halogen element, the perovskite quantum dot layer containing the first halogen element having a carboxyl group;

adding silane containing a second halogen element to the perovskite quantum dot layer containing the first halogen element to make them react with each other, so that at least part of the perovskite quantum dot layer containing the first halogen element is converted to a perovskite quantum dot layer containing the second halogen element, and a siloxane polymer film layer is formed on a side of the perovskite quantum dot layer containing the second halogen element close to the silane containing the second halogen element, and the perovskite quantum dot layer containing the second halogen element and the siloxane polymer film layer are connected by a chemical bond.

Wherein the first halogen element includes Br, and the second halogen element includes Cl;

and/or, the first halogen element includes I, and the second halogen element includes Br.

Wherein the step of adding the silane containing the second halogen element to the perovskite quantum dot layer containing the first halogen element to make them react with each other includes:

making O atom in a hydroxyl group in the carboxyl group in the perovskite quantum dot layer containing the first halogen element be connected to Si atom in the silane containing the second halogen element by a chemical bond, so that O atom in a carboxyl group in a ligand, which forms a coordinate bond with a quantum dot, in the perovskite quantum dot layer containing the second halogen element is connected to Si atom in the siloxane polymer film layer by a chemical bond.

Wherein the siloxane polymer film layer has a —(Si—O—R)$_m$ structure, R is an alkyl group, and m is an integer greater than 1.

In a third aspect, a manufacturing method of a quantum dot light emitting device according to an embodiment of the present disclosure includes:

forming a quantum dot light emitting layer using the manufacturing method of a quantum dot light emitting layer in the above embodiment.

Wherein the step of forming the quantum dot light emitting layer includes:

forming an anode, a hole injection layer and a hole transport layer sequentially, and forming the quantum dot light emitting layer on the hole transport layer;

the manufacturing method further includes: after forming the quantum dot light emitting layer, forming an electron transport layer and a cathode sequentially on the siloxane polymer film layer in the quantum dot light emitting layer.

In a fourth aspect, a display device according to an embodiment of the present disclosure includes the quantum dot light emitting device according to the above embodiment.

BRIEF DESCRIPTION OF THE DRAWINGS

FIG. 3 is another structural diagram of a quantum dot light emitting device according to an embodiment of the present disclosure;

FIG. 4 is a schematic flowchart of a manufacturing method of a quantum dot light emitting layer according to an embodiment of the present disclosure;

Figure 1:
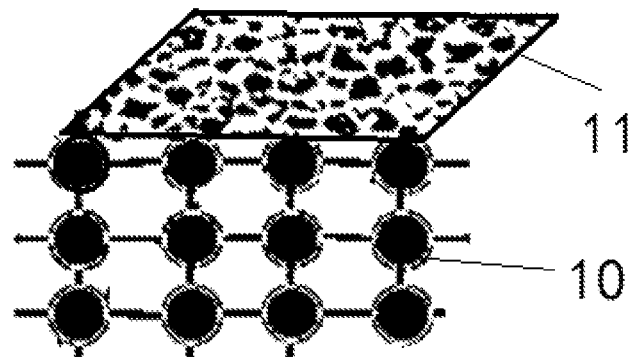
FIG. 1 is a structural diagram of a quantum dot light emitting device according to an embodiment of the present disclosure.

REFERENCE NUMERALS 10 perovskite quantum dot layer containing a second halogen element;
11 siloxane polymer film layer;
12 perovskite quantum dot layer containing a first halogen element;
20 anode;
30 hole injection layer;
40 hole transport layer;
50 electron transport layer;
60 cathode;
70 substrate.

DETAILED DESCRIPTION

In order to make the objectives, technical solutions, and advantages of the embodiments of the present disclosure clearer, the technical solutions of the embodiments of the present disclosure will be described thoroughly and completely in conjunction with the accompanying drawings of the embodiments of the present disclosure. Obviously, the described embodiments are part of the embodiments of the present disclosure, rather than all of the embodiments. Based on the described embodiments of the present disclosure, all other embodiments obtained by a person of ordinary skill in the art fall within the protection scope of the present disclosure.

A quantum dot light emitting device according to an embodiment of the present disclosure will be specifically described below.

A quantum dot light emitting device, a light emitting layer and a manufacturing method thereof, and a display device are aimed to solve the problems that the polar solvent is easy to damage the perovskite quantum dots and reduce the fluorescence performance of the perovskite quantum dots, the electron injection rate and the hole injection rate are unbalanced, too many charge carriers accumulate at the interface barrier, and the stability and performance of the device is reduced.

As shown in FIG. 1, a quantum dot light emitting device according to an embodiment of the present disclosure includes: a perovskite quantum dot layer containing a second halogen element; a siloxane polymer film layer which is provided on a side of the perovskite quantum dot layer containing the second halogen element, the perovskite quantum dot layer containing the second halogen element and the siloxane polymer film layer being connected by a chemical bond.

That is to say, the quantum dot light emitting device is mainly composed of a perovskite quantum dot layer containing a second halogen element and a siloxane polymer film layer, wherein the size of the perovskite quantum dot layer containing the second halogen element may be 3 nm-20 nm, a siloxane polymer film layer is provided on a side of the perovskite quantum dot layer containing the second halogen element, the thickness of the siloxane polymer film layer may be 0.413 nm-3.0 nm. The siloxane polymer film layer can coordinate and passivate the defect sites in the surface of the perovskite quantum dot layer. The siloxane polymer film layer can isolate water and oxygen, avoid the damage of the perovskite quantum dots by the polar solvent, and prevent the degradation or quenching of the fluorescence performance of the perovskite; the perovskite quantum dot layer containing the second halogen element is connected to the siloxane polymer film layer by a chemical bond, which can regulate the carrier injection balance, so that the recombination of electrons and holes is carried out in the light emitting layer, improving the performance of the device.

In some embodiments of the present disclosure, O atom in a carboxyl group in a ligand, which forms a coordinate bond with a quantum dot, in the perovskite quantum dot layer containing the second halogen element is connected to Si atom in the siloxane polymer film layer by a chemical bond, so that the perovskite quantum dot layer containing the second halogen element and the siloxane polymer film layer can be chemically bonded to form an organic whole. Since the siloxane polymer materials have a lower carrier mobility, it can reduce the electron transport rate to a certain extent, thereby regulating the carrier balance and improving the efficiency and stability of the device.

In an embodiment of the present disclosure, the siloxane polymer film layer has a $-(Si-O-R)_m$ structure, where R is an alkyl group, and m is an integer greater than 1. The $-(Si-O-R)_m$ structure in the siloxane polymer film layer is relatively stable, which can better protect the perovskite quantum dot layer containing the second halogen element, and can isolate water and oxygen, avoiding the damage of the perovskite quantum dot layer containing the second halogen element, reducing the electron transport rate and regulating the carrier balance.

In an embodiment of the present disclosure, the second halogen element comprises Cl and/or Br. For example, the perovskite quantum dot layer containing the second halogen element may include $CsPbCl_3$ quantum dots, $CsPbBrCl_2$ quantum dots, $CsPbBr_2Cl$ quantum dots, or $CsPbBr_3$ quantum dots.

Figure 2:
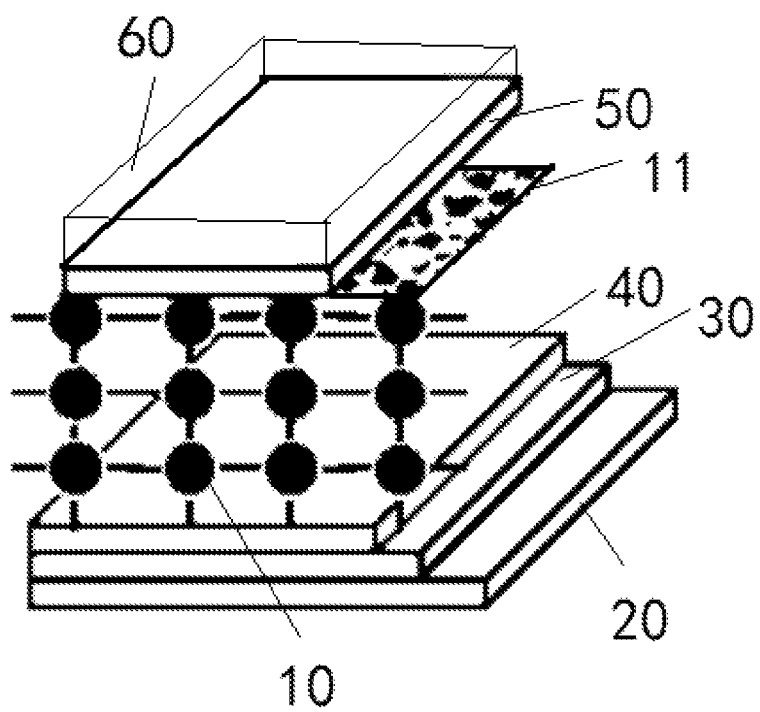
FIG. 2 is another structural diagram of a quantum dot light emitting device according to an embodiment of the present disclosure.

In some embodiments of the present disclosure, as shown in FIGS. 2 and 3, the quantum dot light emitting device may further include an anode 20, a hole injection layer 30, a hole transport layer 40, an electron transport layer 50 and a cathode 60. Wherein the anode 20 may be indium tin oxide (ITO), and holes can be generated through the anode 20. In addition, a substrate 70 may also be included. The substrate 70 may be transparent, such as transparent glass, and the anode 20 may be provided on the substrate 70. The hole injection layer 30 is provided on the anode 20. The hole injection layer 30 may be formed by a spin coating process. The hole injection layer 30 may be the hole injection material of PEDOT (poly(3,4-ethylenedioxythiophene)). PSS (poly(styrenesulfonate)), the hole injection layer 30 may be the hole injection material of PEDOT (poly(3,4-ethylenedioxythiophene)), and can be formed into a film layer through a spin coating process and heating, wherein the film formation temperature may be selected properly according to the actual material, for example, may be selected as 200-230 ☐ or 130-150 ☐, and the film may be formed in the air. The thickness of the hole injection layer 30 may be selected properly according to actual needs, and the thickness of the hole injection layer 30 may be regulated according to the rotation speed of the spin coater.

The hole transport layer 40 is provided on the hole injection layer 30, and the perovskite quantum dot layer 10 containing the second halogen element is provided on the hole transport layer 40. For example, the material of Poly [(9,9-dioctylfluorenyl-2,7-diyl)-co-(4,4'-(N-(4-sec-butylphenyl)diphenylamine)](TFB) may be selected as the organic substance for the hole transport layer. The hole transport layer 40 may be formed through a spin coating process and heated to form a film, wherein the film formation temperature may be selected properly according to the actual material, for example, may be selected as 200-250 ☐, and the film may be formed in an inert gas. The film formation temperature of TFB may be 130-150 ☐ and the film may be formed in an inert gas. The thickness of the hole transport layer 40 may be selected properly, and the thickness of the hole transport layer 40 may be regulated by the rotation speed of the spin coater.

The electron transport layer 50 is provided on the siloxane polymer film layer 11. The material of the electron transport layer 50 may be ZnO nanoparticles or ZnMgO. The electron transport layer 50 may be formed by spin-coating ZnO nanoparticles and heated at 80-120 ☐ to form a film. The material of the electron transport layer 50 may also be selected from ZnO nanoparticles doped with different metals, for example, doped nanoparticles such as magnesium zinc oxide, aluminum zinc oxide, or zirconium zinc oxide or the like. The cathode 60 is provided on the electron transport layer 50, and the electron transport layer 50 is provided between the siloxane polymer film layer 11 and the cathode 60. The material of the cathode 60 may be Al or Mg/Ag, and the cathode 60 may be formed by evaporation, for example, an aluminum film may be formed by evaporation or an indium zinc oxide film may be formed by sputtering, and electrons are generated by the cathode 60; after the cathode is formed, it may be capped and packaged, and ultraviolet curing adhesive may be used to encapsulate the device. The electrons generated by the cathode 60 are transmitted through the electron transport layer 50 to the siloxane polymer film layer 11, and pass through the siloxane polymer film layer 11 to the perovskite quantum dot layer 10 containing the second halogen element. The siloxane polymer film layer 11 has a low carrier mobility, which can reduce the electron transport rate to a certain extent, thereby regulating the carrier balance, and improving the efficiency and stability of the device.

An embodiment of the present disclosure provides a manufacturing method of a quantum dot light emitting layer.

As shown in FIG. 4, the manufacturing method of a quantum dot light emitting layer according to an embodiment of the present disclosure includes:

Step S11, forming a perovskite quantum dot layer containing a first halogen element, the perovskite quantum dot layer containing the first halogen element having a carboxyl group; the perovskite quantum dot layer containing the first halogen element may be dissolved in a low boiling point solvent, such as chloroform, toluene, n-hexane, n-octane or n-heptane. The low boiling point solution of the perovskite quantum dot layer containing the first halogen elements may be spin-coated on a required substrate and dried at 80-120 ☐ to form a film. The specific low boiling point solvent and film formation temperature may be selected according to actual situations.

Step S12, adding silane containing a second halogen element to the perovskite quantum dot layer containing the first halogen element to make them react with each other, so that at least part of the perovskite quantum dot layer containing the first halogen element is converted to a perovskite quantum dot layer containing the second halogen element, and a siloxane polymer film layer is formed on a side of the perovskite quantum dot layer containing the second halogen element close to the silane containing the second halogen element, and the perovskite quantum dot layer containing the second halogen element and the siloxane polymer film layer are connected by a chemical bond. In Step S12, the silane containing the second halogen element may be spin-coated on the perovskite quantum dot layer containing the first halogen element through a spin coating process, and after it is formed into a liquid film, it may be left for a period of time for reaction. Suitable temperature and time may be selected. For example, it may be placed at room temperature for 30 min-120 min, and then the perovskite quantum dot layer containing the second halogen element is formed in situ. The size of the perovskite quantum dot layer containing the second halogen element may be 3 nm-20 nm, and a siloxane polymer film layer is formed on the side of the perovskite quantum dot layer containing the second halogen element close to the silane containing the second halogen element. The thickness of the siloxane polymer film layer is between 0.413 nm and 3.0 nm, and the thickness of the siloxane polymer film layer may be regulated according to actual reaction conditions. In addition, after the perovskite quantum dot layer containing the first halogen element is treated with the silane containing the second halogen element, the composition of the perovskite quantum dot layer can be adjusted, and thereby the spectral range of the quantum dot light emitting layer can be adjusted.

In the process of adding the silane containing the second halogen element to the perovskite quantum dot layer containing the first halogen element for reaction, the silane containing the second halogen element reacts with the carboxyl group in the perovskite quantum dot layer containing the first halogen element, the second halogen ions in the silane can replace the first halogen ions in the perovskite quantum dot layer containing the first halogen element, the silane containing the second halogen element can react with a small amount of water molecules present in the quantum dot layer to be hydrolyzed, and the second halide ion can perform rapid anion exchange (which can be completed between tens of microseconds to a few seconds). Meanwhile, due to the slow reaction rate of the silicon-oxygen bond (which takes several hours to tens of hours to complete), finally, a siloxane polymer film layer is slowly formed.

The second halogen ions in the silane containing the second halogen element can replace part or all of the first halogen ions in the perovskite quantum dot layer containing the first halogen element, so that part or all of the perovskite quantum dot layer containing the first halogen element is converted into a perovskite quantum dot layer containing the second halogen element, and a siloxane polymer film layer is formed on a side of the perovskite quantum dot layer containing the second halogen element close to the silane containing the second halogen element. The siloxane polymer film layer can coordinate and passivate the defect sites in the surface of the perovskite quantum dot layer. The siloxane polymer film layer can isolate water and oxygen, avoid the damage of the perovskite quantum dots by the polar solvent, and prevent the degradation or quenching of the fluorescence performance of the perovskite; the perovskite quantum dot layer containing the second halogen element is connected to the siloxane polymer film layer by a chemical bond, which can regulate the carrier injection balance, so that the recombination of electrons and holes is carried out in the light emitting layer, improving the performance of the device.

In some embodiments, the perovskite quantum dots containing the first halogen element may be $CsPbBr_3$ quantum dots or $CsPbI_3$ quantum dots. When the perovskite quantum dots containing the first halogen element are $CsPbBr_3$ quantum dots, the silane containing the second halogen element may be $RSiCl_3$, where R is an alkyl group, for example, the silane containing the second halogen element may be trimethylchlorosilane, dodecyltrichlorosilane or phenyltrichlorosilane. The Cl ions in $RSiCl_3$ can replace at least one Br ion in $CsPbBr_3$ to generate one or more of $CsPbBrCl_2$, $CsPbBr_2Cl$ or $CsPbBr_3$; when the perovskite quantum dots containing the first halogen element are $CsPbBr_3$ quantum dots, blue quantum dots with high fluorescence performance can be formed in situ by introducing a silane reagent containing the second halogen element. When the perovskite quantum dots containing the first halogen element are $CsPbI_3$ quantum dots, the silane containing the second halogen element may be $RSiBr_3$, where R is an alkyl group, and the Br ions in RSiBr3 can replace at least one I ion in $CsPbI_3$ to generate one or more of $CsPbIBr_2$, $CsPbI_2Br$ or $CsPbI_3$.

Wherein, the perovskite quantum dots in the perovskite quantum dot layer containing the first halogen element may be $ABX_3$ perovskite quantum dots and/or rare-earth-doped $ABX_3$ perovskite quantum dots, where A includes any one or more of: organic amine group, formamidine, and cesium ion; B includes: lead ion, tin ion, bismuth ion or silver ion; at least one of the three halogen X is Br or I. For example, the perovskite quantum dots in the perovskite quantum dot layer containing the first halogen element are: lead-containing perovskite quantum dots, such as organic-inorganic lead halide $MAPbX_3$ quantum dots, all-inorganic cesium lead halide $CsPbX_3$ quantum dots, rare-earth-doped $MAPbX_3$ and $CsPbX_3$ quantum dots, where MA is $CH_3NH_3$, halogen X is Cl, Br or I, and at least one of the three halogen X is Br or I; bismuth-based, tin-based and silver-based perovskite quantum dots, such as $CsSnX_3$ quantum dots, $CsSbX_3$ quantum dots, $Cs_2SnX_6$ quantum dots, Bi-doped $CsSnX_3$, $Cs_2SnX_6$ quantum dots, $Cs_2AgInCl_6$ quantum dots, $MA_3Bi_2Br_9$ quantum dots, $CH_3NH_3SbX_3$ quantum dots, $CH_3NH_3SnX_3$ quantum dots, $CH_3NH_3BiX_3$ quantum dots, or $(CH_3NH_3)_3Bi_2X_9$, etc., wherein the halogen X is Cl, Br or I, and at least one of the three halogen X is Br or I.

In an embodiment of the present disclosure, the first halogen element includes Br, and the second halogen element includes Cl; and/or, the first halogen element includes I, and the second halogen element includes Br. For example, when the first halogen element includes Br and the second halogen element includes Cl, the Cl ion in the Cl-containing silane can replace the Br ion in the perovskite quantum dots containing the first halogen element; when the first halogen element includes I and the second halogen element includes Br, the Br ion in the Br-containing silane can replace the I ion in the perovskite quantum dots containing the first halogen element; the first halogen element may include Br and I, the second halogen element may include Cl and Br, and the Cl ion in the silane containing the second halogen element can replace the Br ion in the perovskite quantum dot containing the first halogen element, and the Br ion in the silane containing the second halogen element can replace the I ion in the perovskite quantum dot containing the first halogen element. By ion replacement, a high-yield perovskite quantum dot layer containing the second halogen element can be obtained, and the fluorescence performance of the perovskite quantum dot layer containing the second halogen element can be improved.

In some embodiments of the present disclosure, the step of adding the silane containing the second halogen element to the perovskite quantum dot layer containing the first halogen element to make them react with each other includes:

making O atom in a hydroxyl group in the carboxyl group in the perovskite quantum dot layer containing the first halogen element be connected to Si atom in the silane containing the second halogen element by a chemical bond, so that O atom in a carboxyl group in a ligand, which forms a coordinate bond with a quantum dot, in the perovskite quantum dot layer containing the second halogen element is connected to Si atom in the siloxane polymer film layer by a chemical bond. The perovskite quantum dot layer containing the second halogen element and the siloxane polymer film layer can be chemically bonded to form an organic whole. Since the siloxane polymer materials have a lower carrier mobility, it can reduce the electron transport rate to a certain extent, thereby regulating the carrier balance.

In an embodiment of the present disclosure, the siloxane polymer film layer has a —$(Si—O—R)_m$ structure, where R is an alkyl group, and m is an integer greater than 1. The —$(Si—O—R)_m$ structure in the siloxane polymer film layer is relatively stable, which can better protect the perovskite quantum dot layer containing the second halogen element, and can isolate water and oxygen, avoiding the damage of the perovskite quantum dot layer containing the second halogen element, reducing the electron transport rate and regulating the carrier balance.

According to the quantum dot light emitting device of the embodiments of the present disclosure, the quantum dot light emitting device includes a perovskite quantum dot layer containing a second halogen element; a siloxane polymer film layer which is provided on a side of the perovskite quantum dot layer containing the second halogen element, the perovskite quantum dot layer containing the second halogen element and the siloxane polymer film layer being connected by a chemical bond. According to the quantum dot light emitting device of the embodiments of the present disclosure, the siloxane polymer film layer is provided on a side of the perovskite quantum dot layer containing the second halogen element, and the siloxane polymer film layer can isolate water and oxygen, avoid the damage of the perovskite quantum dots by the polar solvent, and prevent the degradation or quenching of the fluorescence performance of the perovskite; the perovskite quantum dot layer containing the second halogen element is connected to the siloxane polymer film layer by a chemical bond, which can regulate the carrier injection balance, so that the recombination of electrons and holes is carried out in the light emitting layer, improving the performance of the device.

In an embodiment of the present disclosure, the perovskite quantum dots containing the first halogen element are $CsPbBr_3$ quantum dots, the silane containing the second halogen element may be $RSiCl_3$, where R is an alkyl group, and the manufacturing method for forming a quantum dot light emitting layer by $CsPbBr_3$ quantum dots and $RSiCl_3$ may be as follows:

first, a $CsPbBr_3$ quantum dot layer is formed, and the $CsPbBr_3$ quantum dot layer has a carboxyl group;

then, $RSiCl_3$ silane is added to the $CsPbBr_3$ quantum dot layer to react, so that part or all of the $CsPbBr_3$ quantum dot layer is converted into one or more of $CsPbBrCl_3$ quantum dots, $CsPbBr_3Cl$ quantum dots or $CsPbBr_3$ quantum dots; for example, all the $CsPbBr_3$ quantum dot layer is converted into $CsPbCl_3$ quantum dot layer, and a siloxane polymer film layer is formed on the side of the $CsPbCl_3$ quantum dot layer close to $RSiCl_3$ silane. The $CsPbCl_3$ quantum dot layer and the siloxane polymer film layer are connected by a chemical bond. O atom in the hydroxyl group in the carboxyl group in the original $CsPbCl_3$ quantum dot layer is connected to Si atom in the original $RSiCl_3$ silane by a chemical bond, so that O atom in a carboxyl group in a ligand, which forms a coordinate bond with a quantum dot, in the $CsPbCl_3$ quantum dot layer is connected to Si atom in the siloxane polymer film layer by a chemical bond.

In the process of manufacturing the quantum dot light emitting layer by $CsPbBr_3$ quantum dots and $RSiCl_3$, for example, the $RSiCl_3$ silane can react with the carboxyl group in the oleic acid ligand on the quantum dot in the $CsPbBr_3$ quantum dot layer, and part or all of Cl in $RSiCl_3$ can be replaced with Br in $CsPbBr_3$; the specific reaction process may be as follows:

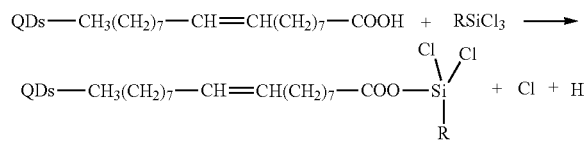

(1)

(2)

(3)

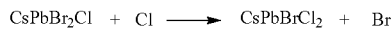

(4)

Through reactions (1) to (4), $CsPbBr_3$ quantum dots can be converted into $CsPbCl_3$ quantum dots, and can also be converted into $CsPbBrCl_2$, $CsPbBr_2Cl$, where QDs represents inorganic crystals of perovskite quantum dots.

If the blue $CsPbCl_3$ quantum dots are directly formed by other methods (such as a high temperature thermal injection method), the yield is low; however, if the blue $CsPbCl_3$ perovskite quantum dots are formed in-situ using the green $CsPbBr_3$ quantum dots with higher yield by anion replacement, the yield is high, and $CsPbCl_3$ quantum dots with high fluorescence performance can be produced, maintaining or improving the fluorescence performance of the light emitting layer to the greatest extent.

Wherein, the $RSiCl_3$ silane can react with the carboxyl group in the oleic acid ligand on the quantum dot in the $CsPbBr_3$ quantum dot layer, and the specific reaction process may be as follows:

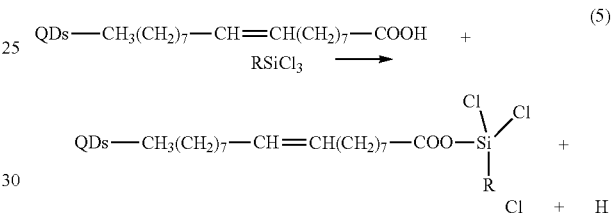

(5)

Where QDs represents inorganic crystals of perovskite quantum dots. The Cl produced in reaction (5) can react with $CsPbBr_3$ quantum dots according to reactions (2)-(4), and then at least one Br in the $CsPbBr_3$ quantum dots is replaced with Cl to produce $CsPbCl_3$ quantum dots, $CsPbBrCl_2$ quantum dots or $CsPbBr_2Cl$ quantum dots.

During the reaction, the $RSiCl_3$ silane can react with a small amount of water molecules in the quantum dot layer. The specific reaction is as follows:

(6)

The hydroxyl group in the silicon-oxygen compound produced in reaction (6) can react with the product in reaction (5). The specific reaction process is as follows:

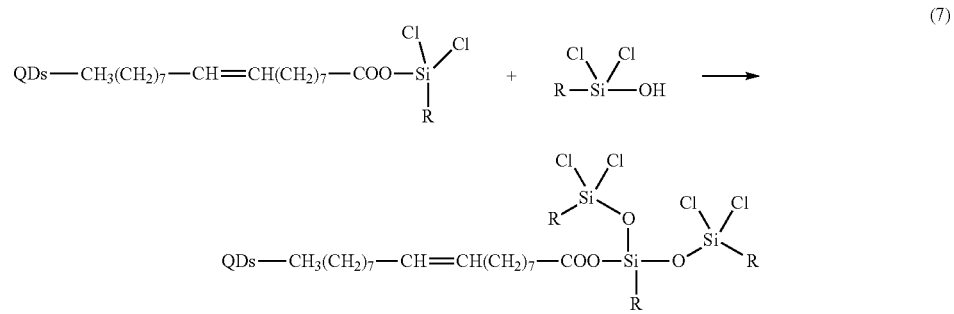

(7)

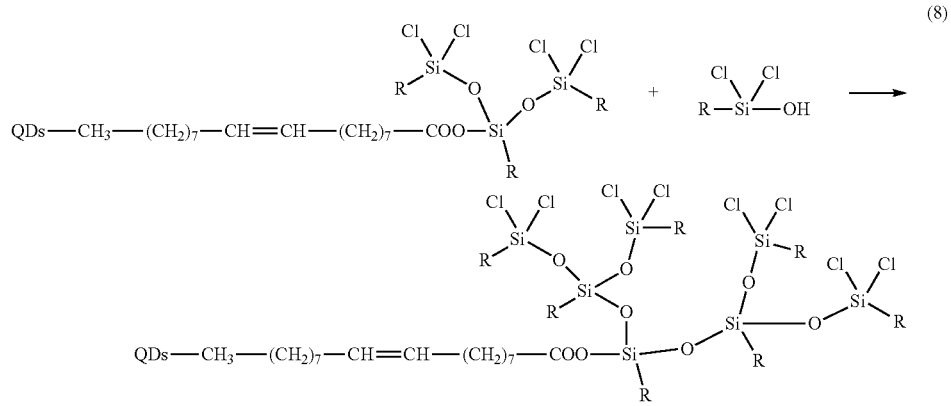

(8)

The compound produced in reaction (8) can be further subject to reactions similar to reactions (7) and (8) to form a network structure, and then form a siloxane polymer film layer on the quantum dot layer. The structural formula of the polymer film layer can be abbreviated as follows: —(Si—OR)$_m$—, where R is an alkyl group, m is an integer greater than 1. The —(Si—OR)$_m$— structure in the siloxane polymer film layer is relatively stable, which can better protect the perovskite quantum dot layer, and can isolate water and oxygen, avoiding the damage of the perovskite quantum dot layer, reducing the electron transport rate and regulating the carrier balance.

In addition, the process and principle of the above reactions can also be extended to manufacturing of Br-containing perovskite quantum dots from I-containing perovskite quantum dots.

An embodiment of the present disclosure provides a manufacturing method of a quantum dot light emitting device.

The manufacturing method of a quantum dot light emitting device includes forming a quantum dot light emitting layer using the manufacturing method of a quantum dot light emitting layer according to the above embodiments.

The manufacturing method of a quantum dot light emitting device according to the embodiment of the present disclosure may include:

forming a perovskite quantum dot layer containing a second halogen element;

forming a siloxane polymer film layer on a side of the perovskite quantum dot layer containing the second halogen element, the perovskite quantum dot layer containing the second halogen element and the siloxane polymer film layer being connected by a chemical bond.

For example, first, a perovskite quantum dot layer containing a first halogen element is formed, and the perovskite quantum dot layer containing the first halogen element has a carboxyl group; silane containing a second halogen element is added to the perovskite quantum dot layer containing the first halogen element to make them react with each other, so that at least part of the perovskite quantum dot layer containing the first halogen element is converted to a perovskite quantum dot layer containing the second halogen element, and a siloxane polymer film layer is formed on a side of the perovskite quantum dot layer containing the second halogen element close to the silane containing the second halogen element, and the perovskite quantum dot layer containing the second halogen element and the siloxane polymer film layer are connected by a chemical bond. The siloxane polymer film layer can coordinate and passivate the defect sites in the surface of the perovskite quantum dot layer. The siloxane polymer film layer can isolate water and oxygen, avoid the damage of the perovskite quantum dots by the polar solvent. The perovskite quantum dot layer containing the second halogen element and the siloxane polymer film layer can be chemically bonded to form an organic whole. Since the siloxane polymer materials have a lower carrier mobility, it can reduce the electron transport rate to a certain extent, thereby regulating the carrier balance and improving the stability and lifetime of the device.

In some embodiments of the present disclosure, O atom in a carboxyl group in a ligand, which forms a coordinate bond with a quantum dot, in the perovskite quantum dot layer containing the second halogen element is connected to Si atom in the siloxane polymer film layer by a chemical bond, so that the perovskite quantum dot layer containing the second halogen element and the siloxane polymer film layer can be chemically bonded to form an organic whole. Since the siloxane polymer materials have a lower carrier mobility, it can reduce the electron transport rate to a certain extent, thereby regulating the carrier balance.

In some other embodiments of the present disclosure, the siloxane polymer film layer has a —(Si—O—R)$_m$ structure, where R is an alkyl group, and m is an integer greater than 1. The —(Si—O—R)$_m$ structure in the siloxane polymer film layer is relatively stable, which can better protect the perovskite quantum dot layer containing the second halogen element, and can isolate water and oxygen, avoiding the damage of the perovskite quantum dot layer containing the second halogen element, reducing the electron transport rate and regulating the carrier balance.

Wherein, the second halogen element includes Cl and/or Br. For example, when the first halogen element includes Br and the silane containing the second halogen element includes Cl, the second halogen element in the perovskite quantum dot layer containing the second halogen element may include Cl; when the first halogen element includes I and the silane containing the second halogen element includes Br, the second halogen element in the perovskite quantum dot layer containing the second halogen element may include Br; when the first halogen element includes Br and I, and the silane containing the second halogen element includes Cl and Br, the second halogen element in the perovskite quantum dot layer containing the second halogen element may include Cl and Br. The second halogen element specifically includes either Cl or Br or both, which can be selected according to actual needs. The replacement may be carried out by an ion replacement method to obtain a perovskite quantum dot layer containing the required second halogen element.

In some embodiments of the present disclosure, the step of forming the quantum dot light emitting layer may include:

forming the anode 20, the hole injection layer 30 and the hole transport layer 40 sequentially, and forming the quantum dot light emitting layer on the hole transport layer 40; the manufacturing method of a quantum dot light emitting layer may further include: after forming the quantum dot light emitting layer, forming the electron transport layer 50 and the cathode 60 sequentially on the siloxane polymer film layer 11 in the quantum dot light emitting layer.

Figure 5A:
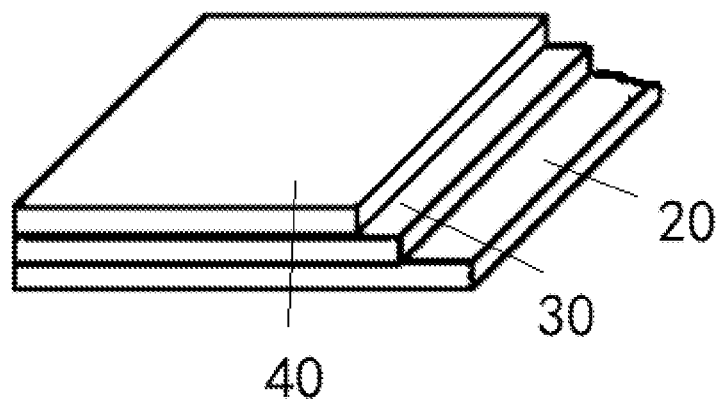
FIG. 5a is a schematic diagram after forming a hole injection layer and a hole transport layer on an anode.
Figure 5B:
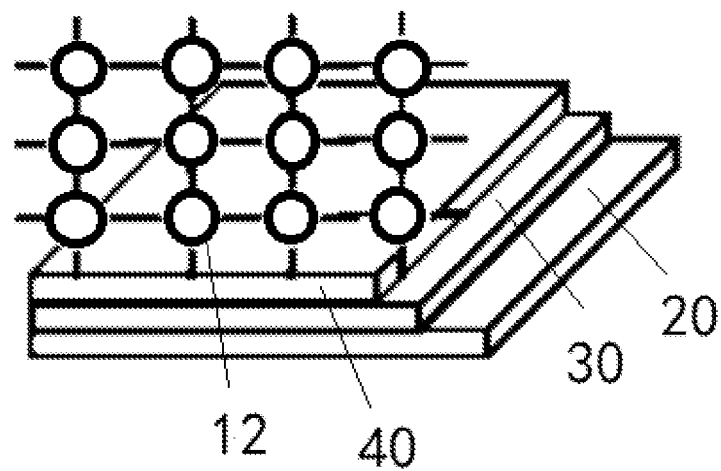
FIG. 5b is a schematic diagram of forming a perovskite quantum dot layer containing a first halogen element.
Figure 5C:
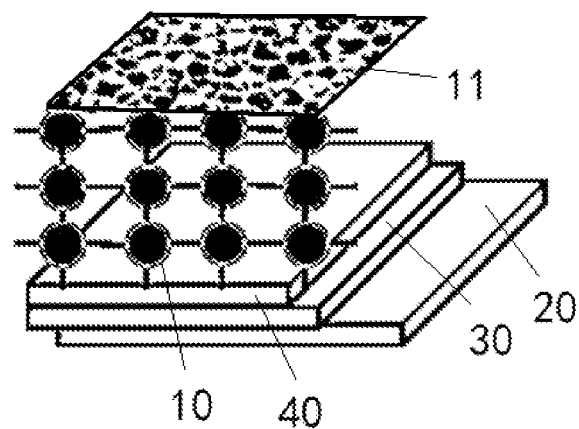
FIG. 5c is a schematic diagram of forming a siloxane polymer film layer.
Figure 5D:
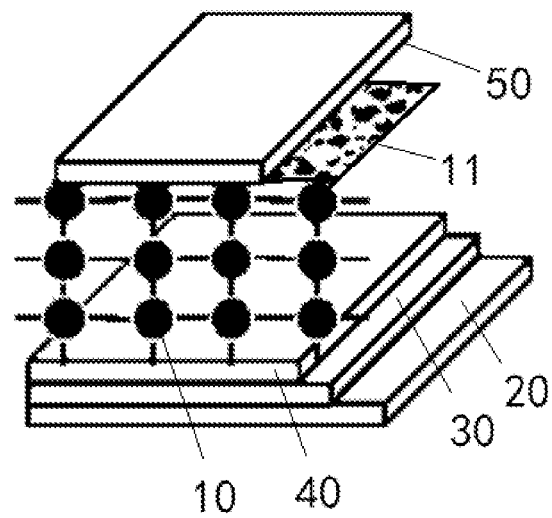
FIG. 5d is a schematic diagram of forming an electron transport layer on the siloxane polymer film layer.

That is to say, before forming the perovskite quantum dot layer 10 containing the second halogen element, the anode 20 is formed; the hole injection layer 30 and the hole transport layer 40 are sequentially formed on the anode 20; after the siloxane polymer film layer 11 is formed on a side of the perovskite quantum dot layer 10 containing the second halogen element, the electron transport layer 50 and the cathode 60 are sequentially formed on the siloxane polymer film layer 11. The anode 20 may be formed on the substrate first, the ITO and the substrate are cleaned by ultrasonic with water and isopropanol, respectively, and treated with ultraviolet light for 5-10 min; as shown in FIG. 5a, the hole injection layer 30 and the hole transport layer 40 are formed sequentially on the anode 20; the perovskite quantum dot layer containing the second halogen element is formed; the siloxane polymer film layer 11 is formed on a side of the perovskite quantum dot layer containing the second halogen element, and the perovskite quantum dot layer containing the second halogen element and the siloxane polymer film layer 11 are connected by a chemical bond. Wherein, as shown in FIG. 5b, the perovskite quantum dot layer 12 containing the first halogen element may be formed first, and the perovskite quantum dot layer 12 containing the first halogen element has a carboxyl group, and the silane containing the second halogen element is added to the perovskite quantum dot layer 12 containing the first halogen element for reaction, so that at least part of the perovskite quantum dot layer 12 containing the first halogen element is converted into the perovskite quantum dot layer 10 containing the second halogen element. As shown in FIG. 5c, the siloxane polymer film layer 11 is formed on the side of the perovskite quantum dot layer 10 containing the second halogen element close to the silane containing the second halogen element; as shown in FIGS. 5d and 2, the electron transport layer 50 and the cathode 60 are sequentially formed on the siloxane polymer film layer 11. The siloxane polymer film layer 11 can isolate water and oxygen. Since the surface functional group of the siloxane polymer film layer 11 is hydroxyl group, in the process of forming the electron transport layer 50, the compatibility with the solution of the electron transport layer material can be enhanced, and damage caused by the solvent (ethanol, etc.) of the electron transport layer material is prevented, avoiding the damage of the perovskite quantum dot layer by the polar solvent, and avoiding the damage caused by the polar solvent during the process of forming the electron transport layer 50. The perovskite quantum dot layer containing the second halogen element and the siloxane polymer film layer 11 can be connected by a chemical bond to form an organic whole. Since the siloxane polymer film layer has a lower carrier mobility, it can reduce the electron transport rate and thereby regulate the carrier balance.

An embodiment of the present disclosure provides a display device which includes the quantum dot light emitting device according to the above embodiment. The display device in the embodiment of the present disclosure has a quantum dot light emitting device, the siloxane polymer film layer in the quantum dot light emitting device has a lower carrier mobility, which can reduce the electron transport rate and thereby regulate the carrier balance, and can improve the stability and lifetime of the device.

Unless otherwise defined, the technical terms or scientific terms used in the present disclosure shall have the usual meanings understood by those of ordinary skills in the art to which this disclosure belongs. Words such as "first", "second" and the like used in the present disclosure do not indicate any order, quantity or importance, but are only used to distinguish different components. Words such as "connecting" or "connected" and the like are not limited to physical or mechanical connections, but may include electrical connections, whether direct or indirect. Words such as "up", "down", "left", "right", etc. are only used to indicate the relative positional relationship. When the absolute position of the described object changes, the relative positional relationship also changes accordingly.

The above are the preferred implementations of the present disclosure. It should be noted that, for those of ordinary skills in the art, without departing from the principles described in the present disclosure, several improvements and modifications can be made, and these improvements and modifications should also be regarded as the protection scope of the present disclosure.

What is claimed is:

1. A quantum dot light emitting device, comprising:
a perovskite quantum dot layer containing a second halogen element;
a siloxane polymer film layer which is provided on a side of the perovskite quantum dot layer containing the second halogen element, the perovskite quantum dot layer containing the second halogen element and the siloxane polymer film layer being connected by a chemical bond.

2. The quantum dot light emitting device according to claim 1, wherein, O atom in a carboxyl group in a ligand, which forms a coordinate bond with a quantum dot, in the perovskite quantum dot layer containing the second halogen element is connected to Si atom in the siloxane polymer film layer by a chemical bond.

3. The quantum dot light emitting device according to claim 1, wherein, the siloxane polymer film layer has a $-(Si-O-R)_m-$ structure, R is an alkyl group, and m is an integer greater than 1.

4. The quantum dot light emitting device according to claim 1, wherein, the second halogen element comprises Cl and/or Br.

5. The quantum dot light emitting device according to claim 1, further comprising:
an anode;
a hole injection layer provided on the anode;
a hole transport layer provided on the hole injection layer, the perovskite quantum dot layer containing the second halogen element being provided on the hole transport layer;
an electron transport layer provided on the siloxane polymer film layer;
a cathode, the electron transport layer being provided between the siloxane polymer film layer and the cathode.

6. A manufacturing method of a quantum dot light emitting layer, comprising:
   forming a perovskite quantum dot layer containing a first halogen element, the perovskite quantum dot layer containing the first halogen element having a carboxyl group;
   adding silane containing a second halogen element to the perovskite quantum dot layer containing the first halogen element to make them react with each other, so that at least part of the perovskite quantum dot layer containing the first halogen element is converted to a perovskite quantum dot layer containing the second halogen element, and a siloxane polymer film layer is formed on a side of the perovskite quantum dot layer containing the second halogen element close to the silane containing the second halogen element, and the perovskite quantum dot layer containing the second halogen element and the siloxane polymer film layer are connected by a chemical bond.

7. The manufacturing method according to claim 6, wherein the first halogen element comprises Br, and the second halogen element comprises Cl;
   and/or, the first halogen element comprises I, and the second halogen element comprises Br.

8. The manufacturing method according to claim 6, wherein the step of adding the silane containing the second halogen element to the perovskite quantum dot layer containing the first halogen element to make them react with each other comprises:
   making O atom in a hydroxyl group in the carboxyl group in the perovskite quantum dot layer containing the first halogen element be connected to Si atom in the silane containing the second halogen element by a chemical bond, so that O atom in a carboxyl group in a ligand, which forms a coordinate bond with a quantum dot, in the perovskite quantum dot layer containing the second halogen element is connected to Si atom in the siloxane polymer film layer by a chemical bond.

9. The manufacturing method according to claim 6, wherein the siloxane polymer film layer has a —(Si—O—R)$_m$— structure, R is an alkyl group, and m is an integer greater than 1.

10. A manufacturing method of a quantum dot light emitting device, comprising:
    forming a quantum dot light emitting layer using the manufacturing method according to claim 6.

11. The manufacturing method according to claim 10, wherein the step of forming the quantum dot light emitting layer comprises:
    forming an anode, a hole injection layer and a hole transport layer sequentially, and forming the quantum dot light emitting layer on the hole transport layer;
    the manufacturing method further comprises: after forming the quantum dot light emitting layer, forming an electron transport layer and a cathode sequentially on the siloxane polymer film layer in the quantum dot light emitting layer.

12. A display device, comprising the quantum dot light emitting device according to claim 1.

13. The manufacturing method according to claim 10, wherein the first halogen element comprises Br, and the second halogen element comprises Cl;
    and/or, the first halogen element comprises I, and the second halogen element comprises Br.

14. The manufacturing method according to claim 10, wherein the step of adding the silane containing the second halogen element to the perovskite quantum dot layer containing the first halogen element to make them react with each other comprises:
    making O atom in a hydroxyl group in the carboxyl group in the perovskite quantum dot layer containing the first halogen element be connected to Si atom in the silane containing the second halogen element by a chemical bond, so that O atom in a carboxyl group in a ligand, which forms a coordinate bond with a quantum dot, in the perovskite quantum dot layer containing the second halogen element is connected to Si atom in the siloxane polymer film layer by a chemical bond.

15. The manufacturing method according to claim 10, wherein the siloxane polymer film layer has a —(Si—O—R)$_m$— structure, R is an alkyl group, and m is an integer greater than 1.

16. The display device according to claim 12, wherein, O atom in a carboxyl group in a ligand, which forms a coordinate bond with a quantum dot, in the perovskite quantum dot layer containing the second halogen element is connected to Si atom in the siloxane polymer film layer by a chemical bond.

17. The display device according to claim 12, wherein, the siloxane polymer film layer has a —(Si—O—R)$_m$— structure, R is an alkyl group, and m is an integer greater than 1.

18. The display device according to claim 12, wherein, the second halogen element comprises Cl and/or Br.

19. The display device according to claim 12, wherein the quantum dot light emitting device further comprises:
    an anode;
    a hole injection layer provided on the anode;
    a hole transport layer provided on the hole injection layer, the perovskite quantum dot layer containing the second halogen element being provided on the hole transport layer;
    an electron transport layer provided on the siloxane polymer film layer;
    a cathode, the electron transport layer being provided between the siloxane polymer film layer and the cathode.

* * * * *